US006435301B1

(12) United States Patent
LaCarrubba

(10) Patent No.: US 6,435,301 B1

(45) Date of Patent: *Aug. 20, 2002

(54) APPARATUS FOR THE REDISTRIABUTION OF ACOUSTIC ENERGY

(76) Inventor: Emanuel LaCarrubba, 506 Olive St., Sausalito, CA (US) 94966

(*) Notice: Subject to any disclaimer, the term of this patent is extended or adjusted under 35 U.S.C. 154(b) by 0 days.

This patent is subject to a terminal disclaimer.

(21) Appl. No.: 09/566,200

(22) Filed: May 5, 2000

Related U.S. Application Data

(63) Continuation-in-part of application No. 09/059,226, filed on Apr. 13, 1998, now Pat. No. 6,068,080.

(51) Int. Cl.[7] .................................................. H05K 5/00

(52) U.S. Cl. ........................ 181/155; 181/175; 181/176

(58) Field of Search ................................ 181/155, 175, 181/176, 144, 146, 199, 30; 381/337, 160

(56) References Cited

U.S. PATENT DOCUMENTS 5,616,892 A * 4/1997 Ferralli ...................... 181/155

* cited by examiner

*Primary Examiner*—Khanh Dang

(74) *Attorney, Agent, or Firm*—Vierra Magen Marcus Harmon & DeNiro LLP

(57) ABSTRACT

An apparatus for the redistribution of acoustic energy is provided which comprises a lens having a reflective surface defined by the surface of revolution (R1) of an elliptical arc (A1) rotated about a line (L) through an angle (α1) and the surface of revolution (R2) of an elliptical arc (A2) rotated about the line (L) through an angle (α2). Each elliptical arc (A1) and (A2) constitutes a portion of an ellipse (E1) or (E2) having a focal point located at a point (F1) on line (L), and shares an end point (P) which lies on the reflective surface and the line (L). The angle (α1) is chosen such that the surface of revolution (R1) is convex with respect to an adjoining surface (S1) and the angle (α2) is chosen such that the surface of revolution (R2) is concave with respect to the adjoining surface (S1).

7 Claims, 4 Drawing Sheets

APPARATUS FOR THE REDISTRIABUTION OF ACOUSTIC ENERGY

This application is a continuation-in-part of U.S. application Ser. 9/059,226, filed on Apr. 13, 1998, which issued as U.S. Pat. No. 6,068,080 on May 30, 2000.

FIELD OF THE INVENTION

This invention relates to reflective devices that, when coupled with a transducer, are capable of redistributing and broadly dispersing sound over a broad spectrum of frequencies with little or no distortion.

BACKGROUND OF THE INVENTION

It is well known in acoustics that the dispersion pattern of a sound source is related to the size of the radiating element. This causes conventional electro-acoustic transducers, or loudspeakers, to have an off-axis response that degrades with increasing frequency. This has long been regarded as a basic problem in loudspeaker design and over the years several different solutions have been proposed. These include the use of multiple transducers, horns and waveguides, electrostatic elements, and acoustic reflectors of varying shapes. Many of these solutions have undesirable side effects such as the introduction of frequency response anomalies and complicated fabrication techniques. Furthermore, these systems as well as conventional loudspeakers can act in unpredictable ways in typical listening environments due to the lack of consideration usually given to the human auditory perceptual system.

The recreation of sound via loudspeakers can be enhanced by controlling the direction, amplitude and spectral content of the sound arriving at the listener's ears via the loudspeaker/listening environment combination. It is the purpose of this invention to address all these issues in a single device which is simple to manufacture. When properly mated to a suitable conventional transducer, the invention causes sound to be transferred to the listening environment with a nearly frequency-invariant horizontal dispersion pattern. This affords a greater number of listeners with timbrally accurate sound with a greater sense of envelopment due to greatly enhanced lateral room reflections. Furthermore, floor and ceiling reflections are reduced causing increased stereophonic phantom image stability.

A number of the invention's features can be modified to suit the designer's particular needs when incorporating the invention into a complete loudspeaker system. For example, modifications to the inventive system may be made to agressively control the vertical directivity of the loudspeaker system. Control of vertical directivity is particularly important in the areas of sound reinforcement and public address systems. Additionally, the inventive system may be used with transducers such as microphones to adapt the system for use as a sound receiving device.

SUMMARY OF THE INVENTION

The present invention addresses these concerns by providing an apparatus for the redistribution of acoustic power which comprises a base, a lens, and a means for mounting the lens upon the base. The base has an upper surface, a lower surface, a front surface, and a rear surface. The rear surface of the base is positionable upon a supporting surface. The lens also has an upper surface, a lower surface, a front surface, and a rear surface.

The front surface of the lens includes a reflective surface, a point P lying on the reflective surface, and at least one adjoining surface S1. A line L passes through the point P and intersects the lower surface of the base at a point B. A point F1 lies on the line L between the point P and the point B. The reflective surface is defined by the surface of revolution R1 of an elliptical arc A1 rotated about the line L through an angle $\alpha$1 and the surface of revolution R2 of an elliptical arc A2 rotated about the line L through an angle $\alpha$2. The elliptical arc A1 constitutes a portion of an ellipse E1 having a focal point located at the point F1 and having a lower end terminating at the point P. The elliptical arc A2 constitutes a portion of an ellipse E2 having a focal point located at said point F1 and having an upper end terminating at said point P. The angle $\alpha$1 is chosen such that the surface of revolution R1 is convex with respect to adjoining surface S1, and the angle $\alpha$2 is chosen such that the surface of revolution R2 is concave with respect to adjoining surface S1.

A primary object of the present invention is to provide an apparatus which redirects acoustic energy radiated from a sound radiator positioned at or proximate to focal point F1 such that the resulting dispersion pattern is very broad over a very wide frequency range horizontally and is limited vertically.

A further object of the present invention is to provide an apparatus which produces horizontally redirected acoustic radiation which is substantially free of frequency response anomalies.

Another object of the present invention is to provide an apparatus with insulative surfaces positioned to tailor the overall acoustic radiation pattern.

Yet another object of the present invention is to provide a loudspeaker system which demonstrates highly controlled vertical directivity.

A further object of the present invention is to provide a sound receiving device with a receiving pattern which is very broad over a very wide frequency range horizontally and is limited vertically.

Other objects and advantages of the present invention will become apparent when the apparatus for redistribution of acoustic radiation of the present invention is considered in conjunction with the accompanying drawings, specification, and claims.

DESCRIPTION OF THE PREFERRED EMBODIMENT

Figure 1:
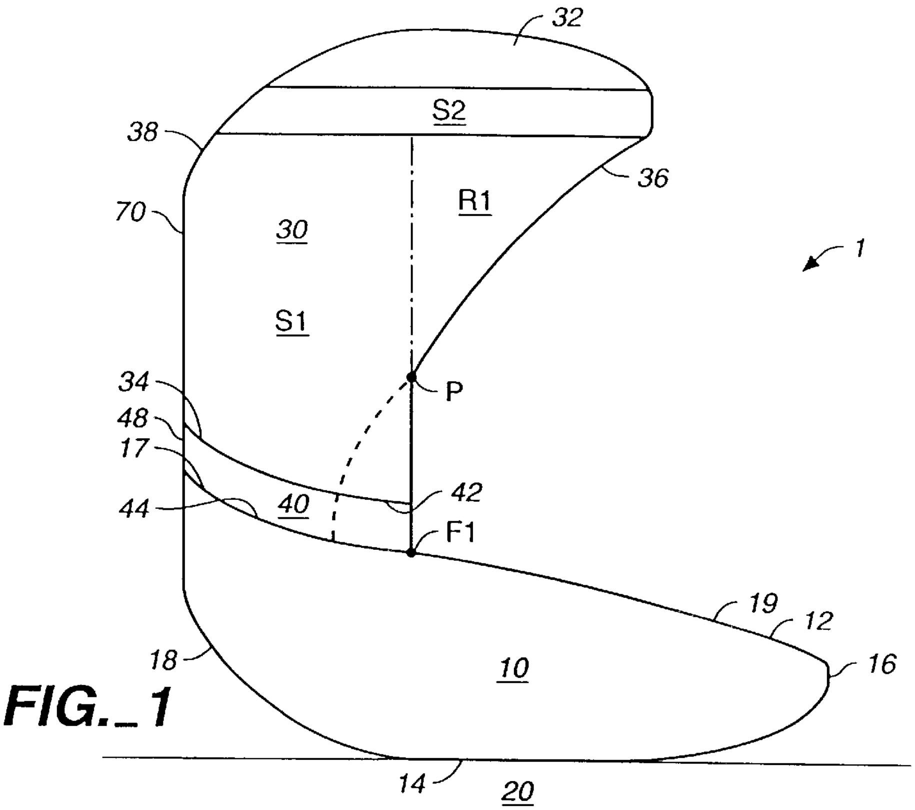
FIG. 1 is a side plan view of an embodiment of the inventive apparatus placed on a supporting surface showing the boundary of an interior reflective surface in phantom.

Referring to FIG. 1, a preferred embodiment of the inventive apparatus 1 for redistribution of acoustic energy is shown. Apparatus 1 comprises a base 10, a lens 30, and a means for mounting lens 30 upon base 10. Base 10 has an upper surface 12, a lower surface 14, a front surface 16, and a rear surface 18. Lower surface 14 is configured such that base 10 is positionable upon a supporting surface 20. Supporting surface 20 shown here is planar; it should be understood, however, that supporting surface 20 can be any surface upon which the user desires to place the inventive apparatus 1.

Figure 2:
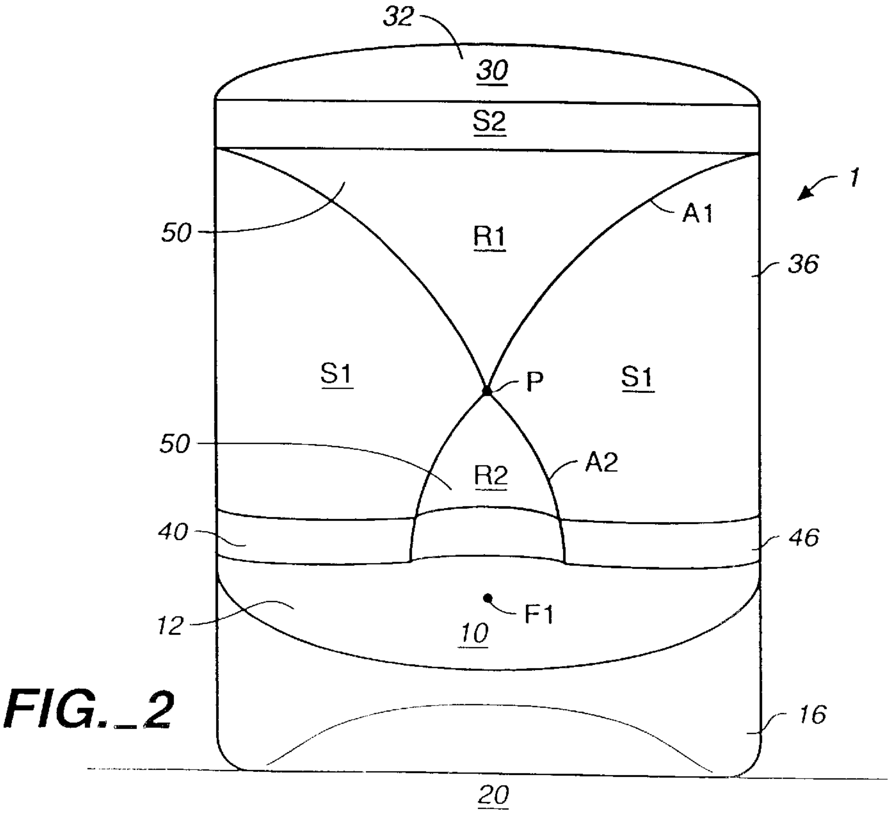
FIG. 2 is a front plan view of an embodiment of the inventive apparatus placed on a supporting surface.
Figure 3:
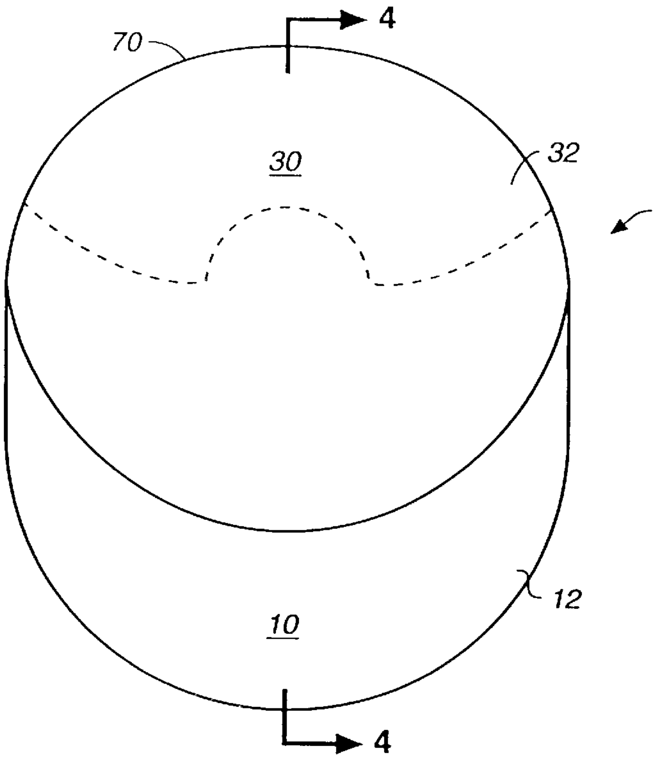
FIG. 3 is a top plan view of an embodiment of the inventive apparatus showing the boundary of the exposed upper surface of its base member in phantom.

Lens 30 has an upper surface 32, a lower surface 34, a front surface 36, and a rear surface 38. Referring to FIG. 2, front surface 36 includes, but is not limited to, a reflective surface 50, a point P lying on reflective surface 50, and at least one adjoining surface S1. Additional adjoining surfaces such as S2 may also be designed.

Figure 4:
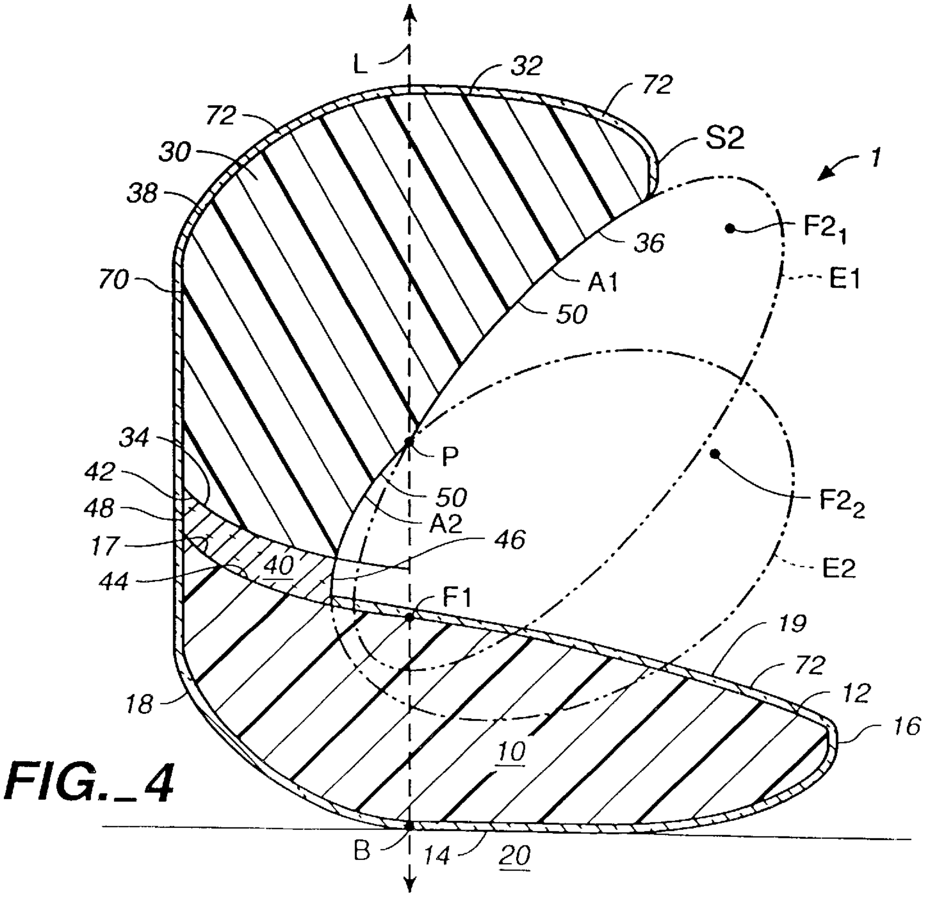
FIG. 4 is a cross-sectional view of the embodiment of the inventive apparatus of FIG. 3 taken at section line 4—4 showing in phantom two ellipses used in the formation of the reflective surface of the inventive apparatus.
Figure 5:
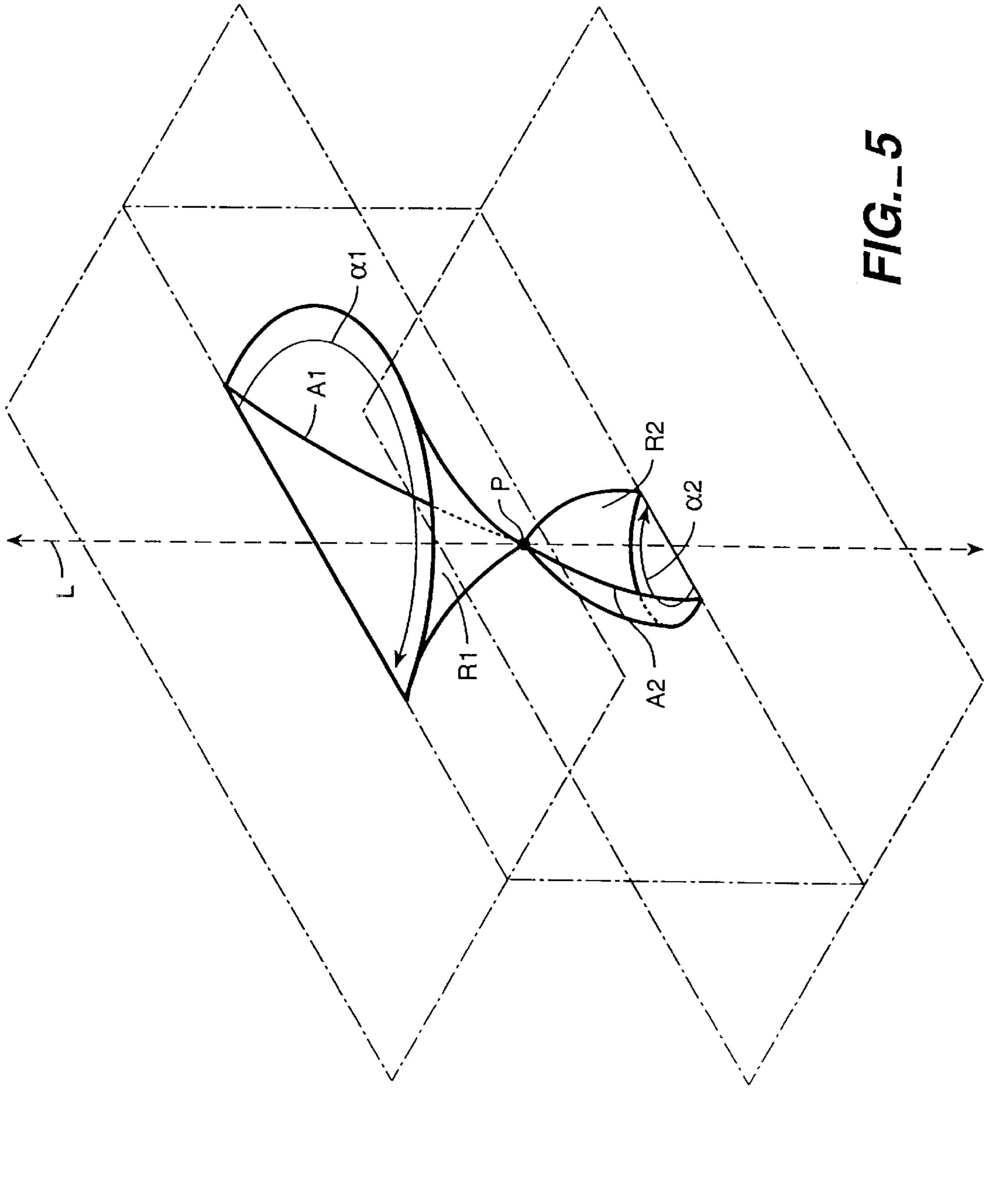
FIG. 5 is a diagram depicting the formation of the two surfaces of rotation which form the reflective surface of the inventive apparatus by the rotation of two elliptical arcs.

Reflective surface 50 is configured to provide optimal dispersion of acoustic radiation emitted from a transducer, and is defined by two surfaces of revolution R1 and R2. Referring to FIG. 4, a line L passes through the point P lying on reflective surface 50 and intersects the lower surface 14 of base 10 at a point B. Two ellipses E1 and E2 can then be chosen such that point P is located on each ellipse E1 and E2, and ellipses E1 and E2 share a common focal point F1 which lies on line L between point P and point B. Ellipse E1 then will have a second focal point $F2_1$, and ellipse E2 will have a second focal point $F2_2$. Ellipse E1 defines an elliptical arc A1 having a lower end terminating at point P, and ellipse E2 defines an elliptical arc A2 having an upper end terminating at point P. Referring to FIG. 5, surface of revolution R1 is formed by rotating elliptical arc A1 through an angle $\alpha 1$, and surface of revolution R2 is formed by rotating elliptical arc A2 through an angle $\alpha 2$. Angle $\alpha 1$ should be chosen such that surface of revolution R1 is convex with regard to adjoining surface S1; angle $\alpha 2$ should be chosen such that surface of revolution R2 is concave with regard to adjoining surface S1.

In an embodiment of the inventive apparatus, the length of elliptical arc A1 is varied constantly as it is rotated about line L at angles $\alpha 1$, while arc A1 always terminates at lower point P. Effectively, this allows the user to produce a number of variances upon reflective surface R1, each having a different upper boundary.

Figure 6:
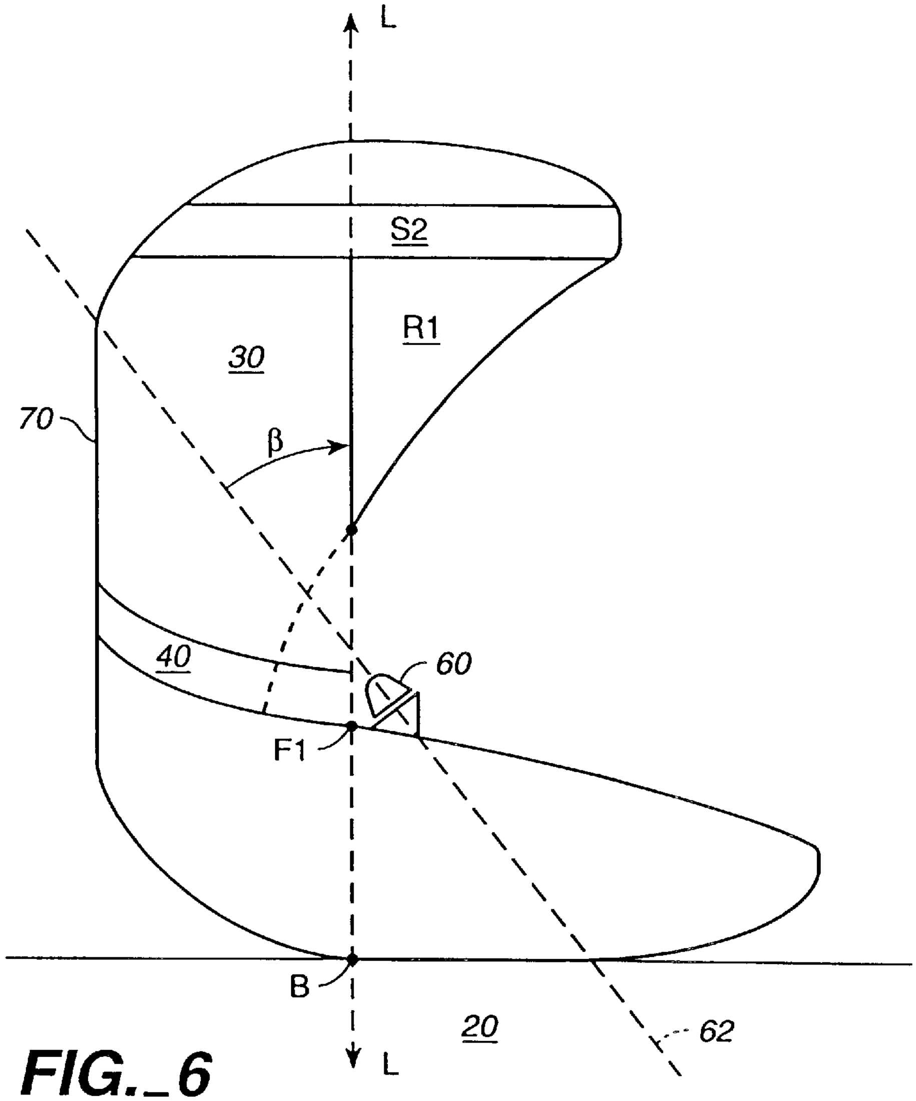
FIG. 6 is a side view of an embodiment of the inventive apparatus having a transducer mounted in a tilted orientation on the upper surface of its base.

Referring to FIG. 6, in operation, a transducer 60 is positioned at or proximate to point F1. Where the inventive apparatus is used as a sound producing device, a broadcasting transducer such as a loudspeaker is preferably used. However, it should be understood that where the inventive apparatus is used as a sound receiving device, a receiving transducer such as a microphone may be used. For purposes of the following discussion, it shall be assumed that the transducer used is a loudspeaker.

Acoustic radiation is emitted from the transducer 60 at F1 and disperses outward in all directions from the transducer's emissive area. Acoustic radiation dispersing towards lens 30 is reflected by reflective surface 50.

While ellipses E1 and E2 may be any two ellipses selected to have the appropriate focal point F1, point P, and arc A1 or A2 described above, they are preferably chosen such that most acoustic radiation striking surfaces R1 and R2 will be reflected upon paths which have a limited vertical component and a broad horizontal component. It should be understood, however, that the directivity of the reflected acoustic radiation, will depend upon many factors including, but not limited to, the positioning of the sound radiator producing the reflected acoustic radiation and the orientation of the reflective surface 50 with regard to the surrounding environment.

The choice of ellipses E1 and E2 and the exact positioning of transducer 60 can be tailored to produce optimal effects.

A parabola is a special case of an ellipse wherein the ellipse's second focal point is positioned infinitely far away from the ellipse's first focal point. Accordingly, it should be understood that the term "elliptical arc" as used herein includes parabolic or "nearly parabolic" arcs. An elliptical arc which is "nearly parabolic," as used herein, is an arc of an ellipse having a major axis length which is at least 2.5 times greater than its minor axis length. Embodiments of the inventive apparatus wherein arcs A1 and A2 are parabolic or nearly parabolic will feature the vertical directivity which is particularly desirable in sound reinforcement and public address systems. The nearly parabolic arcs will control the directivity of the sound waves in a manner substantially consistent with true parabolic arcs.

Transducer 60 may be tilted as shown in FIG. 6, thus changing the direction at which the acoustic energy emitted from the transducer is radiated. The degree to which transducer 60 is tilted, which can be measured by an angle $\beta$ made between an axis 62 of the transducer 60 and the line L, can be varied to tailor the overall frequency response and vertical directivity of the apparatus.

Referring to FIG. 4, the surfaces of apparatus 1 other than reflective surface 50 also affect the overall sound production. Means for mounting lens 30 upon base 10 preferably comprises an absorptive material insulator 40 having an upper surface 42, a lower surface 44, a front surface 46, and a rear surface 48. Lower surface 44 of insulator 40 is fixed upon upper surface 12 of base 10. Lower surface 34 of lens 30 is fixed upon upper surface 42 of insulator 40.

Insulator 40 may be composed of felt or any other appropriate absorptive material. Note that the vertical thickness of insulator 40 has been made large in FIGS. 1 and 4 for purposes of clarity of illustration. Benefits of the use of insulator 40 include, but are not limited to, the reduction of acoustic resonances that might otherwise degrade performance.

The placement of insulator 40 may define a first covered portion 17 and a second uncovered portion 19 of the upper surface 12 of base 10. The uncovered portion 19 of upper surface 12 may slope downwardly. Benefits of such downward sloping include, but are not limited to, the tailoring of vertical dispersion to suit the needs of the designer. It should be understood that absorptive material insulator could entirely cover upper surface 12 of base 10, if increased sound absorption is desired.

Similarly, adjoining surfaces S1 and S2 may be covered with some absorptive material 72 to absorb acoustic radiation which would otherwise reflect from them. This technique can be used to tailor overall system frequency response and limit the amount of horizontal dispersion.

Considering the exterior surfaces of apparatus 1, curved surfaces will typically produce fewer disruptive diffraction effects. Accordingly, front surface 16 preferably forms a curvilinear arc, such as a generally elliptical or circular arc. Additionally, the rear surfaces 18, 38, and 48 of the base 10, lens 30, and insulator 40 preferably together form a rear surface 70 which is curvilinear and connects lower surface 14 of the base 10 to upper surface 32 of the lens 30. Preferably at least a portion of lower surface 14 is curvilinear and slopes upwardly to meet rear surface 70. Lower surface 14 and front surface 16 of base 10, rear surface 70, and upper surface 32 of lens 30 may also be covered with absorptive material 72 to inhibit diffraction effects.

All conventional loudspeaker transducers have a sound power output that increases with decreasing frequency.

Figure 7:
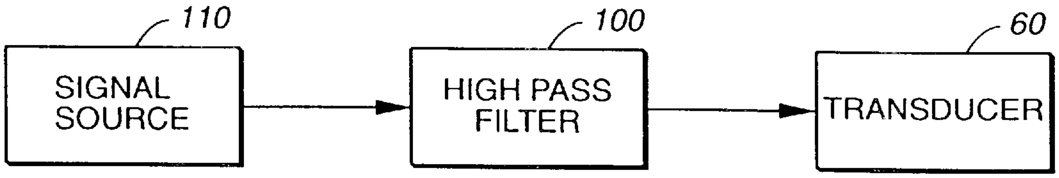
FIG. 7 is a diagram showing the connection of a high pass filter between a power amplifier for the sound system and a transducer used with the inventive apparatus.

Since the apparatus equally redistributes sound power, the overall response of the system will have a corresponding rising response with decreasing frequency. Referring to FIG. 7, to address this problem, in a preferred embodiment a simple high pass filter 100 which decreases electrical energy with decreasing frequency is connected to the transducer 60 of the inventive apparatus. The output of a signal source 110 used to drive the sound system passes through filter 100, causing the system to have an output at all frequencies that is substantially equal. Where multiple transducers 60 are installed in a sound system employing the apparatus, the filter may be part of the crossover network used to connect the multiple transducers 60.

While the inventive apparatus has been described in terms of redistributing acoustic energy, it should be understood that the inventive apparatus could also be used to redistribute other energy waveforms such as electromagnetic waves.

Although the foregoing invention has been described in some detail by way of illustration for purposes of clarity of understanding, it will be readily apparent to those of ordinary skill in the art in light of the teachings of this invention that certain changes and modifications may be made thereto without departing from the spirit or scope of the appended claims.

It is claimed:

1. An apparatus (1) for the redistribution of acoustic energy, comprising:

a base (10) having a lower surface (14);

a lens (30) having a front surface (36); and means for mounting said lens (30) upon said base (10);

said front surface (36) of said lens (30) including a reflective surface (50), a point (P) lying on said reflective surface (50), and at least one adjoining surface (S1), a line (L) passing through said point (P) and intersecting the lower surface (14) of said base (10) at a point (B), a point (F1) lying on said line (L) between said point (P) and said point (B), said reflective surface (50) defined by the surface of revolution (R1) of an elliptical arc (A1) rotated about said line (L) through an angle (α1) and the surface of revolution (R2) of an elliptical arc (A2) rotated about said line (L) through an angle (α2), said elliptical arc A1 having a lower end terminating at said point (P) and constituting a portion of an ellipse (E1) having a focal point located at said point (F1), said elliptical arc (A2) having an upper end terminating at said point (P) and constituting a portion of an ellipse (E2) having a focal point located at said point (F1), said angle (α1) chosen such that said surface of revolution (R1) is convex with respect to said adjoining surface (S1), said angle (α2) chosen such that said surface of revolution (R2) is concave with respect to said adjoining surface (S1).

2. The apparatus (1) of claim 1 wherein at least one of said elliptical arcs A1 and A2 is parabolic.

3. The apparatus (1) of claim 1 wherein at least one of said elliptical arcs A1 and A2 is nearly parabolic.

4. The apparatus (1) of claim 1 wherein both of said elliptical arcs A1 and A2 are parabolic or nearly parabolic.

5. The apparatus (1) of claim 4 further comprising a transducer (60) positioned at or proximate to said point (F1).

6. The apparatus (1) of claim 5 wherein said transducer (60) is a loudspeaker.

7. The apparatus (1) of claim 5 wherein said transducer (60) is a microphone.

* * * * *